United States Patent
Keh et al.

(10) Patent No.: US 10,074,437 B2
(45) Date of Patent: Sep. 11, 2018

(54) SEMICONDUCTOR MEMORY DEVICE AND OPERATING METHOD THEREOF

(71) Applicant: SK hynix Inc., Gyeonggi-do (KR)

(72) Inventors: Jee-Yeon Keh, Gyeonggi-do (KR); Jeong-Hun Lee, Chungcheongbuk-do (KR); Sun-Ki Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/624,953

(22) Filed: Jun. 16, 2017

(65) Prior Publication Data

US 2018/0137924 A1    May 17, 2018

(30) Foreign Application Priority Data

Nov. 17, 2016    (KR) .......................... 10-2016-0153294

(51) Int. Cl.
| | |
|---|---|
| *G11C 16/10* | (2006.01) |
| *G11C 16/28* | (2006.01) |
| *G11C 16/32* | (2006.01) |
| *G11C 16/30* | (2006.01) |

(52) U.S. Cl.
CPC .............. *G11C 16/28* (2013.01); *G11C 16/10* (2013.01); *G11C 16/30* (2013.01); *G11C 16/32* (2013.01)

(58) Field of Classification Search
CPC ............................... G11C 16/10; G11C 16/26
USPC ......................................... 365/185.2, 185.24
See application file for complete search history.

(56) References Cited

U.S. PATENT DOCUMENTS

| | | | | |
|---|---|---|---|---|
| 5,450,085 | A * | 9/1995 | Stewart ................... | H03M 1/02 341/156 |
| 8,648,618 | B1 * | 2/2014 | Shih ........................ | G01R 31/40 324/762.01 |
| 9,330,750 | B2 * | 5/2016 | Lee ......................... | G11C 5/147 |
| 9,455,692 | B2 * | 9/2016 | Ok .......................... | H03K 5/08 |
| 9,634,560 | B2 * | 4/2017 | Ek ........................... | H02M 3/07 |
| 2006/0279999 | A1 * | 12/2006 | Byeon .................... | G11C 16/16 365/185.29 |
| 2009/0033589 | A1 * | 2/2009 | Ozaki ...................... | G09G 3/22 345/55 |
| 2009/0045796 | A1 * | 2/2009 | Kang ...................... | G05F 1/575 323/318 |
| 2010/0014607 | A1 * | 1/2010 | Kibune .................. | H03M 1/108 375/286 |
| 2010/0225511 | A1 * | 9/2010 | Nishimura ........... | G09G 3/3688 341/118 |
| 2011/0148481 | A1 * | 6/2011 | Chung ................... | H03K 4/501 327/137 |
| 2011/0157249 | A1 * | 6/2011 | Park ...................... | G09G 3/3275 345/690 |
| 2011/0227891 | A1 * | 9/2011 | Lee ....................... | G09G 3/3655 345/211 |

(Continued)

FOREIGN PATENT DOCUMENTS

KR    1020120005348    1/2012

*Primary Examiner* — Michael Tran
(74) *Attorney, Agent, or Firm* — IP & T Group LLP

(57) ABSTRACT

A semiconductor memory device includes a reference voltage generation block suitable for selecting and outputting one of a plurality of reference voltages in response to a voltage division enable signal, as an input reference voltage, in response to a selection enable signal; and a control signal generation block suitable for generating the voltage division enable signal and the selection enable signal in response to a reference voltage information.

19 Claims, 6 Drawing Sheets

(56) References Cited

U.S. PATENT DOCUMENTS

| | | | | |
|---|---|---|---|---|
| 2012/0212201 A1* | 8/2012 | Lee | ...................... | H02M 3/073 |
| | | | | 323/282 |
| 2012/0256675 A1* | 10/2012 | Lee | ...................... | G11C 5/147 |
| | | | | 327/333 |
| 2013/0034121 A1* | 2/2013 | Lee | ...................... | G01K 13/00 |
| | | | | 374/152 |
| 2013/0107641 A1* | 5/2013 | Lee | ...................... | G11C 7/1045 |
| | | | | 365/189.09 |
| 2013/0201043 A1* | 8/2013 | Wong | .................... | H03M 1/125 |
| | | | | 341/122 |
| 2013/0284931 A1* | 10/2013 | Nagahisa | ................. | G01J 5/02 |
| | | | | 250/349 |
| 2014/0266835 A1* | 9/2014 | Price | .................... | H03M 1/808 |
| | | | | 341/145 |
| 2015/0052622 A1* | 2/2015 | Cabler | .................... | G09C 1/00 |
| | | | | 726/34 |
| 2015/0078086 A1* | 3/2015 | Lee | .................... | G11C 16/0483 |
| | | | | 365/185.11 |
| 2016/0098959 A1* | 4/2016 | Moon | .................. | G09G 3/2092 |
| | | | | 345/205 |
| 2016/0267833 A1* | 9/2016 | Lee | .................... | H05B 33/0803 |

\* cited by examiner

SEMICONDUCTOR MEMORY DEVICE AND OPERATING METHOD THEREOF

CROSS-REFERENCE TO RELATED APPLICATION

This application claims priority under 35 U.S.C. § 119 to Korean Patent Application No. 10-2016-0153294 filed on Nov. 17, 2016 in the Korean Intellectual Property Office, the disclosure of which is incorporated herein by reference in its entirety.

TECHNICAL FIELD

Exemplary embodiments relate to a semiconductor design technology, and more particularly, to a semiconductor memory device which generates a reference voltage and an operating method thereof.

DISCUSSION OF THE RELATED ART

Circuits included in a semiconductor memory device transmit and receive digital signals including data. A circuit which receives a digital signal compares the levels of a reference voltage and the digital signal using an input buffer configured by a comparator having the form of a differential amplifier, and thereby determines whether the digital signal is a logic high level or a logic low level.

A reference voltage is set to a middle value between a potential defining a logic high level and a potential defining a logic low level, and serves as an absolute voltage which discriminates the logic level of an inputted digital signal.

In general, a reference voltage generation circuit which generates a reference voltage starts to operate after a power-up period is ended, and operates in such a way as to select one among a plurality of levels which are generated by voltage division through a plurality of resistor elements, as the level of the reference voltage.

Since the reference voltage generation circuit operating in this manner continuously retains an activated state after the power-up period is ended, current consumption increases and a lengthy time is required for the level of the reference voltage to be raised to a selected level.

SUMMARY

Various embodiments are directed to a semiconductor memory device which generates a reference voltage in such a way as to shorten the stabilization time of an input reference voltage.

In an embodiment, a semiconductor memory device may include: a reference voltage generation block suitable for selecting and outputting one of a plurality of reference voltages in response to a voltage division enable signal, as an input reference voltage, in response to a selection enable signal; and a control signal generation block suitable for generating the voltage division enable signal and the selection enable signal in response to a reference voltage information.

The reference voltage information may include information regarding operation of the reference voltage generation block.

The selection enable signal may be activated earlier than the voltage division enable signal in a first operation period, and the voltage division enable signal may be deactivated earlier than the selection enable signal in a second operation period.

The reference voltage generation block may include: an enable signal generation unit suitable for generating an enable signal in response to an internal refresh signal and the voltage division enable signal; a voltage division unit suitable for voltage-dividing the power supply voltage in response to the enable signal, and generating the plurality of reference voltages; a decoding unit suitable for decoding external mode control signals, and generating decoding signals; and a selection unit suitable for selecting one among the plurality of reference voltages as the input reference voltage in response to the selection enable signal and the decoding signals.

The internal refresh signal includes an initialization signal and a refresh signal.

The control signal generation block may include: a delay unit suitable for delaying a power-down signal by a predetermined time, and generating a power-down delay signal; a voltage division enable signal generation unit suitable for receiving the power-down signal and the power-down delay signal, and generating the voltage division enable signal; and a selection enable signal generation unit suitable for receiving the power-down signal and the power-down delay signal, and generating the selection enable signal.

The power-down signal may include a signal which has the reference voltage information.

The semiconductor memory device may further include: a data input circuit suitable for buffering a plurality of data in response to the input reference voltage, and outputting a plurality of input data.

The data input circuit may include: a plurality of comparators suitable of generating the plurality of input data, each of the plurality of comparators suitable for comparing the input reference voltage and each of the plurality of input data, and generating each of the plurality of input data.

In an embodiment, a semiconductor device may include: a memory controller suitable for applying a plurality of data and a command; and a memory device suitable for generating a voltage division enable signal and a selection enable signal in response to a reference voltage information, generating a plurality of reference voltages by receiving the plurality of data and the command, and outputting selectively an input reference voltage from one among the plurality of reference voltages, wherein the selection enable signal is activated earlier than the voltage division enable signal in a first operation period, and is deactivated later than the voltage division enable signal in a second operation period that operates opposite to the first operation period.

The reference voltage information may include information regarding on operation or off operation of a reference voltage generation block, the first operation period may be a period in which the reference voltage generation block is changed from the on operation to the off operation and the second operation period may be a period in which the reference voltage generation bock is changed from the off operation to the on operation.

The memory device may include: a command decoder suitable for decoding the command, and generating a refresh signal; a reference voltage generation block suitable for selecting and outputting one of a plurality of reference voltages in response to the voltage division enable signal, as the input reference voltage, in response to the selection enable signal; and a control signal generation block suitable for generating the voltage division enable signal and the selection enable signal in response to the reference voltage information.

The reference voltage generation block may include: an enable signal generation unit suitable for generating an enable signal in response to an initialization signal, the refresh signal and the voltage division enable signal; a voltage division unit suitable for voltage-dividing the power supply voltage in response to the enable signal, and generating the plurality of reference voltages; a decoding unit suitable for decoding external mode control signals, and generating decoding signals; and a selection unit suitable for selecting one among the plurality of reference voltages as the input reference voltage in response to the selection enable signal and the decoding signals.

The control signal generation block may include: a delay unit suitable for delaying a power-down signal having the reference voltage information by a predetermined time, and generating a power-down delay signal; a voltage division enable signal generation unit suitable for receiving the power-down signal and the power-down delay signal, and generating the voltage division enable signal; and a selection enable signal generation unit suitable for receiving the power-down signal and the power-down delay signal, and generating the selection enable signal.

The memory device may further include: a data input circuit suitable for buffering a plurality of data in response to the input reference voltage, and outputting a plurality of input data.

The data input circuit may include: a plurality of comparators suitable of generating the plurality of input data, each of the plurality of comparators suitable for comparing the input reference voltage and each of the plurality of input data, and generating each of the plurality of input data.

In an embodiment, a method for operating a semiconductor memory device may include: controlling timings of a voltage division enable signal and a selection enable signal; generating a plurality of reference voltages in response to the voltage division enable signal; and outputting one reference voltage among the plurality of reference voltages, as an input reference voltage in response to the selection enable signal, wherein the selection enable signal is activated earlier than the voltage division enable signal, and is deactivated later than the voltage division enable signal.

The selection enable signal may be activated earlier than the voltage division enable signal when an operation for generating the reference voltages is changed from an on operation to an off operation, and may be deactivated later than the voltage division enable signal when the operation for generating the reference voltages is changed from the off operation to the on operation.

The controlling of the timings of the voltage division enable signal and the selection enable signal may include: generating the selection enable signal through a NORing operation and an inverting operation for a power-down signal which has a reference voltage information and a signal which is generated through delaying the power-down signal by a predetermined time; and generating the voltage division enable signal through a NANDing operation and an inverting operation for the power-down signal and the signal which is generated through delaying the power-down signal by the predetermined time.

The method may further include: buffering a plurality of data in response to the input reference voltage, and outputting a plurality of input data.

DETAILED DESCRIPTION

Figure 1:
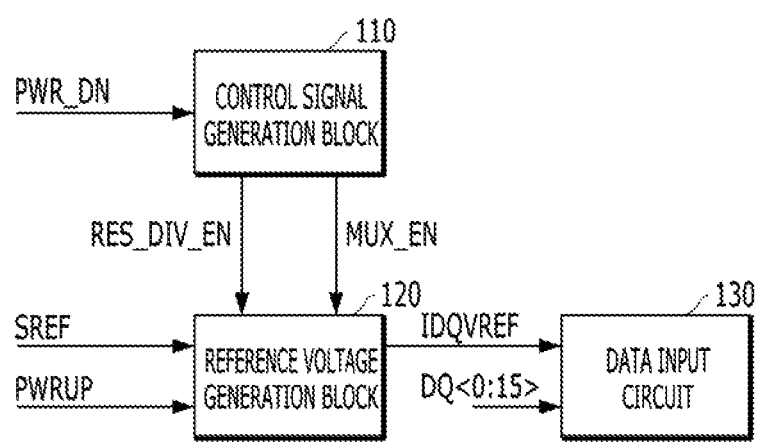
FIG. 1 is a diagram illustrating a semiconductor memory device in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram illustrating a semiconductor memory device in accordance with an embodiment.

Referring to FIG. 1, the semiconductor memory device may include a control signal generation block 110, a reference voltage generation block 120, and a data input circuit 130.

Figure 2:
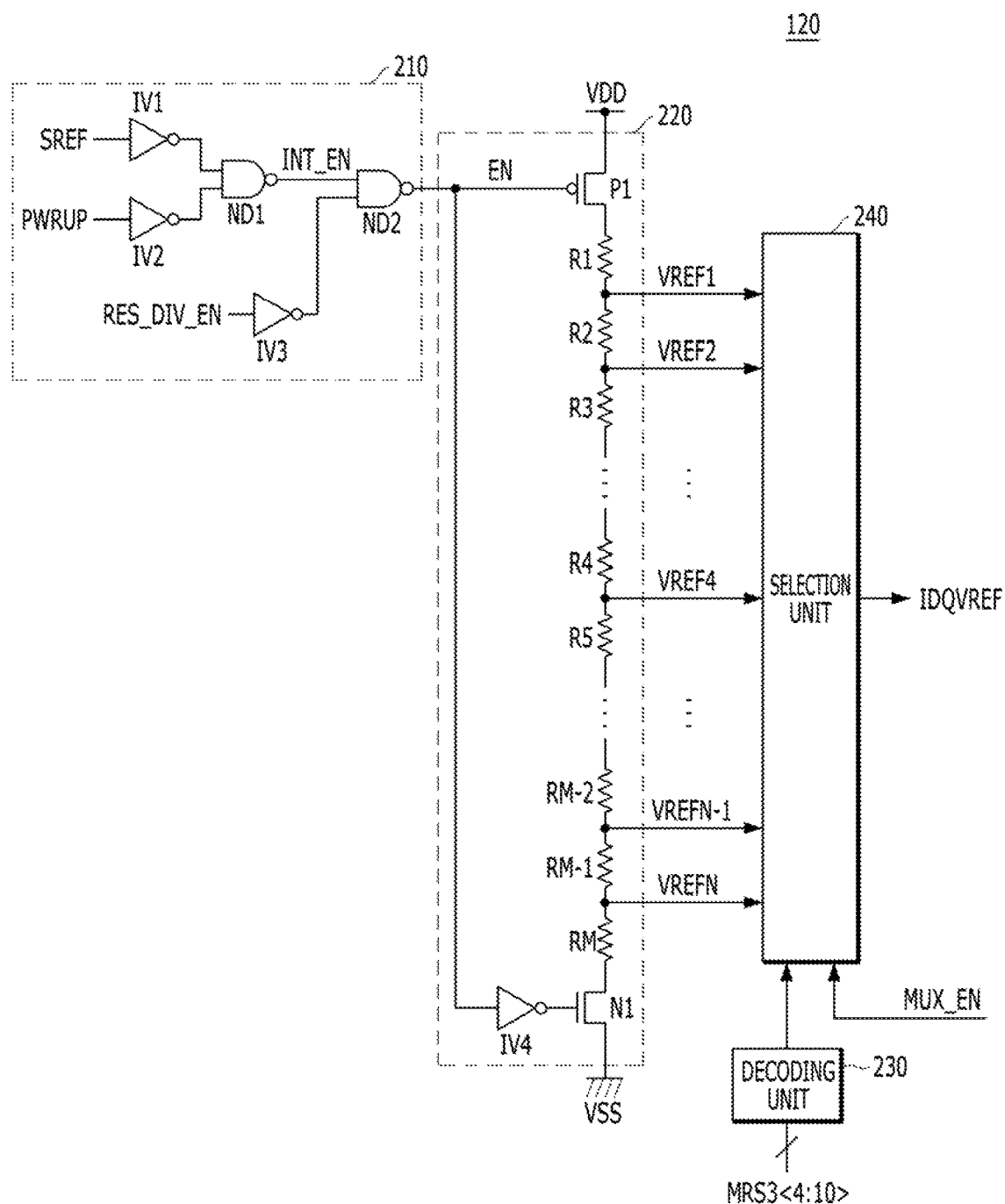
FIG. 2 is a circuit diagram illustrating the reference voltage generation block shown in FIG. 1.

The reference voltage generation block 120 may select and output one among a plurality of reference voltages such as, shown in FIG. 2 which are generated by dividing a power supply voltage VDD, as an input reference voltage IDQVREF, when a power-up period is ended and is not in a self-refresh mode in response to a power-up signal as an initialization signal PWRUP and a self-refresh signal SREF.

In outputting the input reference voltage IDQVREF, the reference voltage generation block 120 may be controlled in internal operation timings in response to a selection enable signal MUX_EN and a voltage division enable signal RES_DIV_EN which are outputted from the control signal generation block 110 to be described later. For example, while the reference voltage generation block 120 may be configured by a voltage division unit for dividing a voltage, a selection unit for selecting one reference voltage among a plurality of reference voltages, and so forth, the voltage division unit and the selection unit may be activated in their operations in response to the voltage division enable signal RES_DIV_EN and the selection enable signal MUX_EN. Detailed descriptions for the reference voltage generation block 120 will be made with reference to FIG. 2.

The control signal generation block 110 may generate the selection enable signal MUX_EN and the voltage division enable signal RES_DIV_EN in response to a power-down signal PWR_DN. The power-down signal PWR_DN as a signal which has information on a period for saving current may be a signal which has information on timings to turn on/off a reference voltage.

When, in the embodiment of the present disclosure, the control signal generation block 110 generates the selection enable signal MUX_EN and the voltage division enable signal RES_DIV_EN by using the power-down signal PWR_DN, however any signal may be used so long as it is a signal for determining a period to distinguish the turn-on/off of a reference voltage, according to a purpose for which the reference voltage is used.

Figure 6:
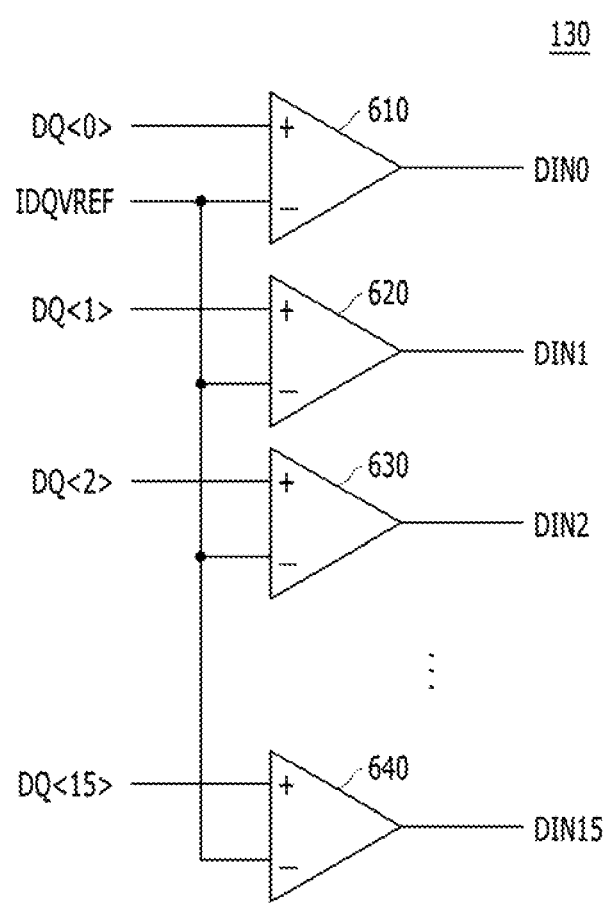
FIG. 6 is a circuit diagram illustrating the data input circuit shown in FIG. 1.

The data input circuit 130 may generate a plurality of input data such as, shown in FIG. 6, by comparing the input reference voltage IDQVREF and a plurality of data DQ<0:15>.

FIG. 2 is a circuit diagram illustrating the reference voltage generation block 120 shown in FIG. 1.

Referring to FIG. 2, the reference voltage generation block 120 may include an enable signal generation unit 210, a voltage division unit 220, a decoding unit 230, and a selection unit 240.

The enable signal generation unit 210 may generate an enable signal EN for activating the voltage division unit 220, in response to an initialization signal PWRUP and the self-refresh signal SREF. The initialization signal PWRUP may be a power-up signal. The enable signal generation unit 210 may include a plurality of inverters IV1, IV2 and IV3 and a plurality of NAND gates ND1 and ND2. The inverters IV1 and IV2 may invert the self-refresh signal SREF and the initialization signal PWRUP and output inverted signals, respectively. As the NAND gate ND1 performs a NAND logic function for the inverted signals, an internal enable signal INT_EN is generated. As the NAND gate ND2 performs a NAND logic function for the internal enable signal INT_EN and the inverted signal generated by inverting the voltage division enable signal RES_DIV_EN through the inverter IV3, the enable signal EN may be generated. The voltage division enable signal RES_DIV_EN may be a signal which is generated by the control signal generation block 110 shown in FIG. 1. A circuit and operation for generating the voltage division enable signal RES_DIV_EN will be described in detail with reference to FIGS. 3 and 4.

The voltage division unit 220 may divide the power supply voltage VDD in response to the enable signal EN, and generate a plurality of reference voltages VREF1 to VREFN which have different voltage levels.

The voltage division unit 220 includes PMOS transistor P1, an inverter IV4, an NMOS transistor N1 and a plurality of resistor elements R1 to RM. The PMOS transistor P1 receives the enable signal EN. The inverter IV4 inverts the enable signal EN. The NMOS transistor N1 receives the inverted signal of the enable signal EN by the inverter IV4. The plurality of resistor elements R1 to RM divide the power supply voltage VDD and generate the plurality of reference voltages VREF1 to VREFN.

The decoding unit 230 may decode a plurality of external mode control signals MRS3<4:10>, and generate a plurality of decoding signals (not shown) which are enabled selectively. The external mode control signals MRS3<4:10> as mode register set signals, may set values that are received from an external system. The plurality of decoding signals which are enabled selectively depending on the logic level combination of the plurality of external mode control signals MRS3<4:10> may be set variously according to embodiments.

The selection unit 240 may be enabled in response to the selection enable signal MUX_EN, may select one among the plurality of reference voltages VREF1 to VREFN in response to the plurality of decoding signals, and may output the selected reference voltage as the input reference voltage IDQVREF. A signal to be outputted as the input reference voltage IDQVREF, among the plurality of reference voltages VREF1 to VREFN, according to the plurality of decoding signals may be set variously according to embodiments.

In the reference voltage generation block 120 configured as mentioned above, when the self-refresh mode is not entered after the power-up period is ended and the voltage division enable signal RES_DIV_EN has a logic low level the voltage division unit 220 may be driven by the enable signal EN having a logic low level and the plurality of reference voltages VREF1 to VREFN may be generated, and one of the plurality of reference voltages VREF1 to VREFN may be selected according to the logic level combination of the plurality of external mode control signals MRS3<4:10> and the selection enable signal MUX_EN having a logic low level, and the input reference voltage IDQVREF may be outputted.

The reference voltage generation block 120 may control the on/off operations of the voltage division unit 220 in response to the voltage division enable signal RES_DIV_EN and may control the on/off operations of the selection unit 240 in response to the selection enable signal MUX_EN. The selection enable signal MUX_EN may become the logic low level earlier than the voltage division enable signal RES_DIV_EN, and turn on the selection unit 240 when the operation of the reference voltage generation block 120 is activated, that is, the enable signal EN has the logic low level. In contrast, the selection enable sigma MUX_EN may become a logic high level later than the voltage division enable signal RES_DIV_EN and turn off the selection unit 240 when the operation of the reference voltage generation block 120 is ended, that is, the enable signal EN has a logic high level. The on/off timings of the selection enable signal MUX_EN and the voltage division enable signal RES_DIV_EN may be controlled by the control signal generation block 110 shown in FIG. 1.

Figure 3:
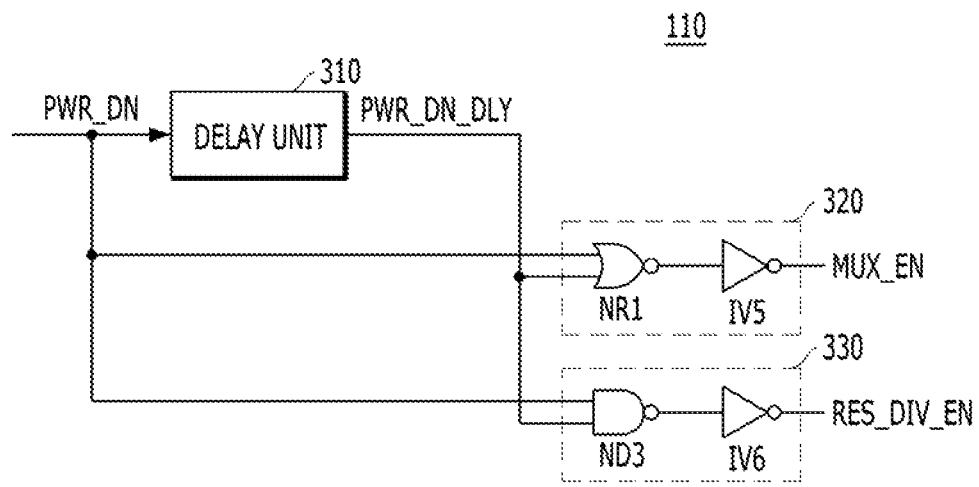
FIG. 3 is a circuit diagram illustrating the control signal generation block shown in FIG. 1.

FIG. 3 is a circuit diagram illustrating the control signal generation block 110 shown in FIG. 1.

Referring to FIG. 3, the control signal generation block 110 may include a delay unit 310, a selection enable signal generation unit 320, and a voltage division enable signal generation unit 330.

The delay unit 310 may delay the power-down signal PWR_DN by a predetermined time, and generate a power-down delay signal PWR_DN_DLY. The delay unit 310 may be configured variously according to embodiments. For example, the delay unit 310 may be configured by a plurality of inverter delay circuits.

The selection enable signal generation unit 320 may be configured by a NOR gate NR1 and an inverter IV5. The NOR gate NR1 receives the power-down signal PWR_DN and the power-down delay signal PWR_DN_DLY and performs a NOR logic function. The inverter IV5 inverts the signal outputted through the NOR gate NR1 and outputs the selection enable signal MUX_EN.

The voltage division enable signal generation unit 330 may be configured by a NAND gate ND3 and an inverter IV6. The NAND gate ND3 receives the power-down signal PWR_DN and the power-down delay signal PWR_DN_DLY and performs a NAND logic function. The inverter IV6 inverts the signal outputted through the NAND gate ND3 and outputs the voltage division enable signal RES_DIV_EN.

The power-down signal PWR_DN which is a signal that controls turn-on/off of an operation may be a signal which has information on a period for saving current. Therefore, the power-down signal PWR_DN may be used as a signal which has information on timings to turn on/off the input reference voltage IDQVREF.

The operation of the control signal generation block 110 which operates through the above-described configuration will be described below with reference to the timing diagram of FIG. 4.

Figure 4:
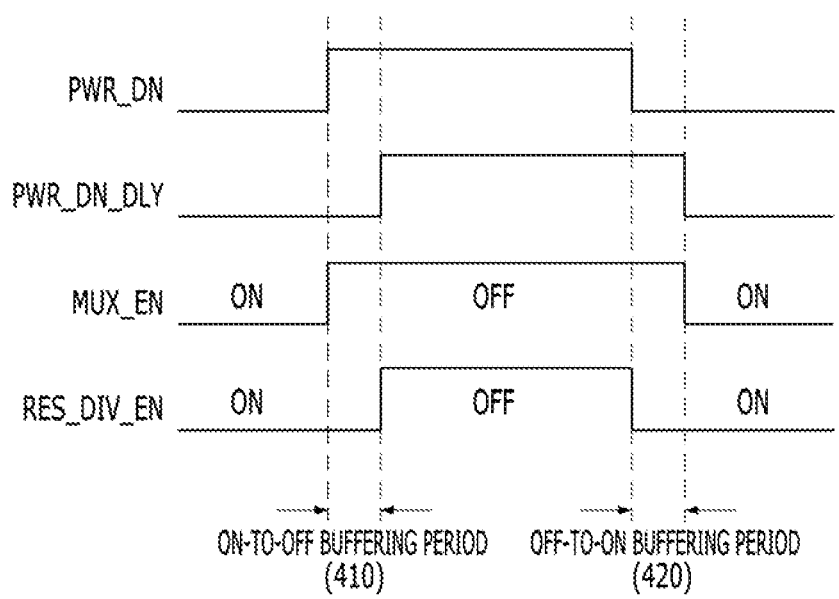
FIG. 4 is a timing diagram illustrating the operation of the control signal generation block shown in FIG. 3.

FIG. 4 is a timing diagram illustrating the operation of the control signal generation block 110 shown in FIG. 3.

Referring to FIG. 4, the power-down signal PWR_DN may be activated first, and, by delaying the power-down signal PWR_DN by the predetermined time through the delay unit 310, the power-down delay signal PWR_DN_DLY may be generated.

The power-down signal PWR_DN and the power-down delay signal PWR_DN_DLY may be outputted as the selection enable signal MUX_EN through the NORing and inverting operations of the selection enable signal generation unit 320. Furthermore, the power-down signal PWR_DN and the power-down delay signal PWR_DN_DLY may be outputted as the voltage division enable signal RES_DIV_EN through the NANDing and inverting operations of the voltage division enable signal generation unit 330.

In detail, the selection enable signal MUX_EN may be activated and turned off earlier than the voltage division enable signal RES_DIV_EN in a first operation period 410 as an on-to-off buffering period in which the operation of the reference voltage generation block 120 is changed from an on operation to an off operation. Then, the selection enable signal MUX_EN may be deactivated and turned on later than the voltage division enable signal RES_DIV_EN in a second operation period 420 as an off-to-on buffering period in which the operation of the reference voltage generation block 120 is changed from an off operation to an on operation. That is, the selection unit 240 is turned on after the plurality of reference voltages VREF1 to VREFN are generated, and all of the plurality of reference voltages VREF1 to VREFN are generated after the selection unit 240 is turned off earlier, whereby it is possible to control a signal having an undesired level not to be inputted. Therefore, when generating the input reference voltage IDQVREF, a stabilization time to till the input reference voltage IDQVREF having an optimal level is outputted may be shortened, and due to this fact, current to be consumed in a fixed pattern may be reduced.

Figure 5A:
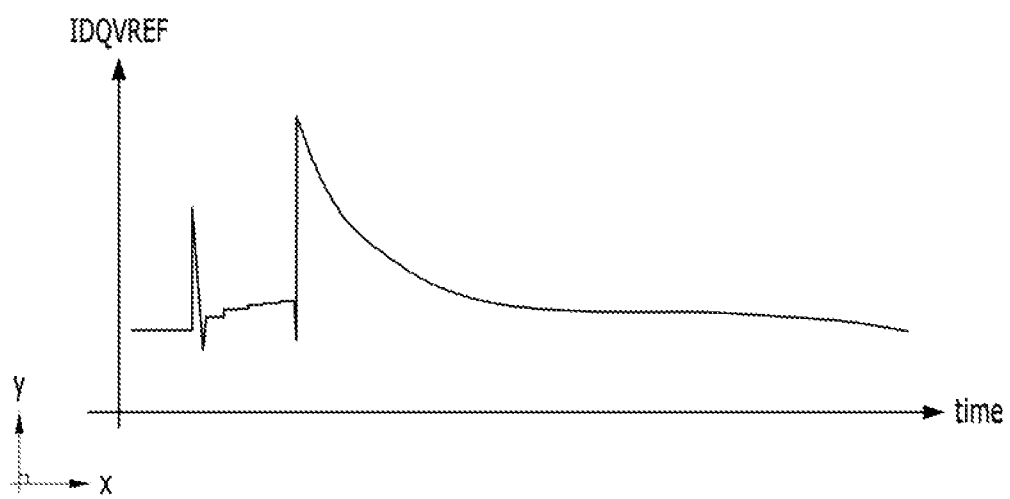
FIGS. 5A and 5B are timing diagrams illustrating variations of an input reference voltage according to a comparative example and the embodiment of the present disclosure.
Figure 5B:
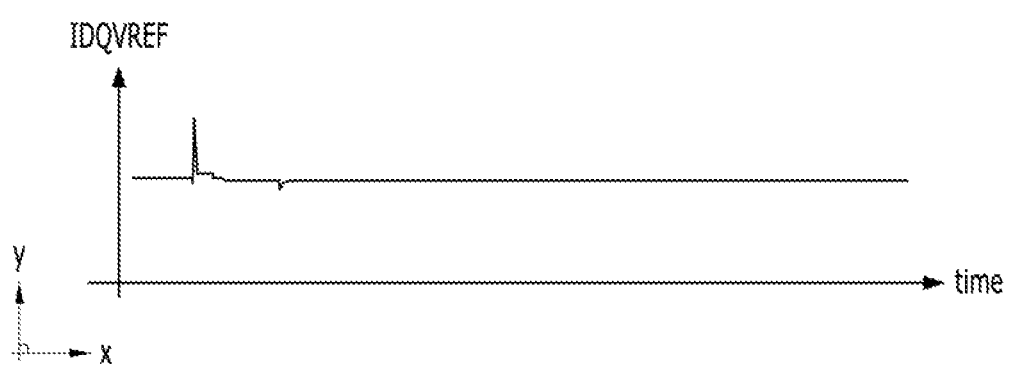

FIGS. 5A and 5B are timing diagrams illustrating variations of the input reference voltage IDQVREF according to a comparative example and the embodiment of the present disclosure. In FIGS. 5A and 5B, the x axis may represent time, and the y axis may represent voltage level variation of the input reference voltage IDQVREF.

FIG. 5A is a timing diagram that represents the variation of the voltage level of the input reference voltage IDQVREF according to a comparative example. As an example FIG. 5A is a timing diagram for the case when the on/off timings of the reference voltage generation block 120 are not controlled through the selection enable signal MUX_EN and the voltage division enable signal RES_DIV_EN.

FIG. 5B is a timing diagram that represents the variation of the voltage level of the input reference voltage IDQVREF according to the embodiment of the present disclosure. As an example, FIG. 5B is a timing diagram for the case when the on/off timings of the reference voltage generation block 120 are controlled through the selection enable signal MUX_EN and the voltage division enable signal RES_DIV_EN.

When comparing FIGS. 5A and 5B, it may be seen that FIG. 5A takes a longer time than FIG. 5B for a reference voltage to be stabilized and accordingly the variation of the voltage level of the input reference voltage IDQVREF is large, whereas it may be seen that FIG. 5B takes a relatively short time until a reference voltage is stabilized and the variation of the voltage level of the input reference voltage IDQVREF is small.

That is, in the embodiment of the present disclosure, since the turn-on/off of the reference voltage generation block 120 may be controlled by controlling the on/off timings of the selection enable signal MUX_EN and the voltage division enable signal RES_DIV_EN, a time until a reference voltage is stabilized may be shortened and the variation of the voltage level of the input reference voltage IDQVREF may decreased, whereby an amount of current consumption may be reduced.

FIG. 6 is a circuit diagram illustrating the data input circuit 130 shown in FIG. 1.

Referring to FIG. 6, the data input circuit 130 may include a plurality of comparators 610 to 640, Each of the plurality of comparators 610 to 640 compares the input reference voltage IDQVREF and the plurality of data DQ<0:15> and generates a plurality of input data DIN0 to DIN15, respectively.

Each of the plurality of comparators 610 to 640 may be realized by a differential amplifier circuit.

The data input circuit 130 configured as described above may buffer the plurality of data DQ<0:15> in response to the input reference voltage IDQVREF, and output the plurality of input data DIN0 to DIN15.

Figure 7:
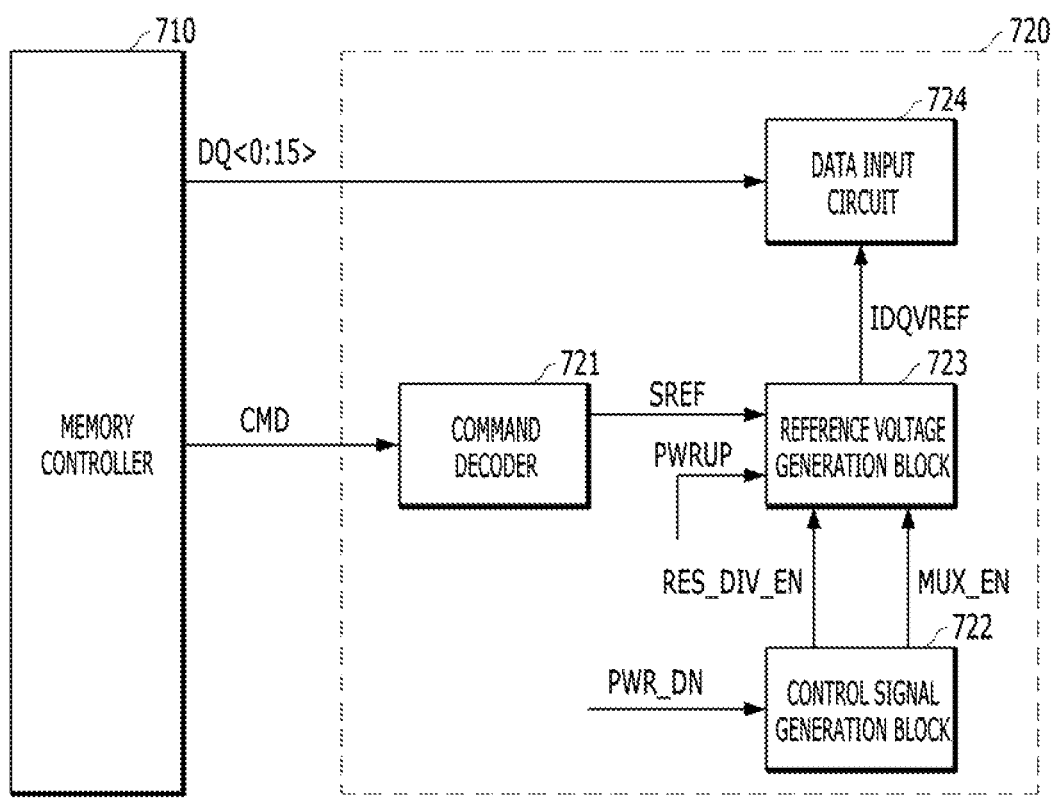
FIG. 7 is a diagram illustrating a semiconductor device in accordance with an embodiment.

FIG. 7 is a diagram illustrating a semiconductor device in accordance with an embodiment.

Referring to FIG. 7, the semiconductor device may include a memory controller 710 and a memory device 720.

The memory controller 710 may apply a plurality of data DQ<0:15> and a command CMD to the memory device 720. The memory device 720 may receive the plurality of data DQ<0:15> and the command CMD from the memory controller 710 and perform an internal operation.

The memory device 720 may include a command decoder 721, a control signal generation block 722, a reference voltage generation block 723, and a data input circuit 724.

The command decoder 721 may decode the command CMD received from the memory controller 710, and generate a self-refresh signal SREF for performing a self-refresh operation.

The control signal generation block 722 may generate a voltage division enable signal RES_DIV_EN and a selection enable signal MUX_EN for controlling the on/off timings of the reference voltage generation block 723, in response to an initialization signal as a power-down signal PWR_DN. Since the control signal generation block 722 has the same configuration and performs the same operation as the control signal generation block 110 shown in FIG. 1, detailed descriptions thereof will be omitted herein.

The reference voltage generation block 723 may operate in response to the self-refresh signal SREF and the initialization signal PWRUP, and generate an input reference voltage IDQVREF by controlling internal operation timings in response to the voltage division enable signal RES_DIV_EN and the selection enable signal MUX_EN. Since the reference voltage generation block 723 has the same configuration and performs the same operation as the reference voltage generation block 120 shown in FIG. 1, detailed descriptions thereof will be omitted herein.

The data input circuit 724 may generate a plurality of input data (not shown) by comparing the plurality of respective data DQ<0:15> received from the memory controller 710 and the input reference voltage IDQVREF. Since the data input circuit 724 has the same configuration and performs the same operation as the data input circuit 130 shown in FIG. 1, detailed descriptions thereof will be omitted herein.

Summarizing these, in the semiconductor device in accordance with the embodiment of the present disclosure, when generating the input reference voltage IDQVREF, a time until the voltage level of the input reference voltage IDQVREF is stabilized may be shortened by controlling the on/off timings of the voltage division enable signal RES_DIV_EN and the selection enable signal MUX_EN which control the internal operation of the reference voltage generation block 723, and due to this fact, an amount of current consumption may also be reduced.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
 a reference voltage generation block suitable for selecting and outputting one of a plurality of reference voltages in response to a voltage division enable signal, as an input reference voltage, in response to a selection enable signal; and
 a control signal generation block suitable for generating the voltage division enable signal and the selection enable signal in response to a reference voltage information,
 wherein the selection enable signal is activated earlier than the voltage division enable signal in a first operation period, and the voltage division enable signal is deactivated earlier than the selection enable signal in a second operation period.

2. The semiconductor memory device according to claim 1, wherein the reference voltage information includes information regarding operation of the reference voltage generation block.

3. The semiconductor memory device according to claim 1, wherein the reference voltage generation block comprises:
 an enable signal generation unit suitable for generating an enable signal in response to an internal refresh signal and the voltage division enable signal;
 a voltage division unit suitable for voltage-dividing the power supply voltage in response to the enable signal, and generating the plurality of reference voltages;
 a decoding unit suitable for decoding external mode control signals, and generating decoding signals; and
 a selection unit suitable for selecting one among the plurality of reference voltages as the input reference voltage in response to the selection enable signal and the decoding signals.

4. The semiconductor memory device according to claim 3, wherein the internal refresh signal includes an initialization signal and a refresh signal.

5. The semiconductor memory device according to claim 1, wherein the control signal generation block comprises:
 a delay unit suitable for delaying a power-down signal by a predetermined time, and generating a power-down delay signal;
 a voltage division enable signal generation unit suitable for receiving the power-down signal and the power-down delay signal, and generating the voltage division enable signal; and
 a selection enable signal generation unit suitable for receiving the power-down signal and the power-down delay signal, and generating the selection enable signal.

6. The semiconductor memory device according to claim 5, wherein the power-down signal includes a signal which has the reference voltage information.

7. The semiconductor memory device according to claim 1, further comprising:
 a data input circuit suitable for buffering a plurality of data in response to the input reference voltage, and outputting a plurality of input data.

8. The semiconductor memory device according to claim 7, wherein the data input circuit comprises:
 a plurality of comparators suitable of generating the plurality of input data, each of the plurality of comparators suitable for comparing the input reference voltage and each of the plurality of input data, and generating each of the plurality of input data.

9. A semiconductor device comprising:
 a memory controller suitable for applying a plurality of data and a command; and
 a memory device suitable for generating a voltage division enable signal and a selection enable signal in response to a reference voltage information, generating a plurality of reference voltages by receiving the plurality of data and the command, and outputting selectively an input reference voltage from one among the plurality of reference voltages,
 wherein the selection enable signal is activated earlier than the voltage division enable signal in a first operation period, and is deactivated later than the voltage division enable signal in a second operation period that operates opposite to the first operation period.

10. The semiconductor device according to claim 9, wherein the reference voltage information includes information regarding on operation or off operation of a reference voltage generation block, the first operation period is a period in which the reference voltage generation block is changed from the on operation to the off operation, and the second operation period is a period in which the reference voltage generation bock is changed from the off operation to the on operation.

11. The semiconductor device according to claim 9, wherein the memory device comprises:
 a command decoder suitable for decoding the command, and generating a refresh signal;
 a reference voltage generation block suitable for selecting and outputting one of a plurality of reference voltages in response to the voltage division enable signal, as the input reference voltage, in response to the selection enable signal; and
 a control signal generation block suitable for generating the voltage division enable signal and the selection enable signal in response to the reference voltage information.

12. The semiconductor device according to claim 11, wherein the reference voltage generation block comprises:
 an enable signal generation unit suitable for generating an enable signal in response to an initialization signal, the refresh signal and the voltage division enable signal;
 a voltage division unit suitable for voltage-dividing the power supply voltage in response to the enable signal, and generating the plurality of reference voltages;
 a decoding unit suitable for decoding external mode control signals, and generating decoding signals; and
 a selection unit suitable for selecting one among the plurality of reference voltages as the input reference voltage in response to the selection enable signal and the decoding signals.

13. The semiconductor device according to claim 11, wherein the control signal generation block comprises:
a delay unit suitable for delaying a power-down signal having the reference voltage information by a predetermined time, and generating a power-down delay signal;
a voltage division enable signal generation unit suitable for receiving the power-down signal and the power-down delay signal, and generating the voltage division enable signal; and
a selection enable signal generation unit suitable for receiving the power-down signal and the power-down delay signal, and generating the selection enable signal.

14. The semiconductor device according to claim 9, wherein the memory device further comprises:
a data input circuit suitable for buffering a plurality of data in response to the input reference voltage, and outputting a plurality of input data.

15. The semiconductor device according to claim 14, wherein the data input circuit comprises:
a plurality of comparators suitable of generating the plurality of input data, each of the plurality of comparators suitable for comparing the input reference voltage and each of the plurality of input data, and generating each of the plurality of input data.

16. A method for operating a semiconductor memory device, comprising:
controlling timings of a voltage division enable signal and a selection enable signal;
generating a plurality of reference voltages in response to the voltage division enable signal; and
outputting one reference voltage among the plurality of reference voltages, as an input reference voltage, in response to the selection enable signal,
wherein the selection enable signal is activated earlier than the voltage division enable signal, and is deactivated later than the voltage division enable signal.

17. The method according to claim 16, wherein the selection enable signal is activated earlier than the voltage division enable signal when an operation for generating the reference voltages is changed from an on operation to an off operation, and is deactivated later than the voltage division enable signal when the operation for generating the reference voltages is changed from the off operation to the on operation.

18. The method according to claim 17, wherein the controlling of the timings of the voltage division enable signal and the selection enable signal comprises:
generating the selection enable signal through a NORing operation and an inverting operation for a power-down signal which has a reference voltage information and a signal which is generated through delaying the power-down signal by a predetermined time; and
generating the voltage division enable signal through a NANDing operation and an inverting operation for the power-down signal and the signal which is generated through delaying the power-down signal by the predetermined time.

19. The method according to claim 18, further comprising:
buffering a plurality of data in response to the input reference voltage, and outputting a plurality of input data.

* * * * *